United States Patent [19]

Nashimoto

[11] Patent Number: 5,206,528
[45] Date of Patent: Apr. 27, 1993

[54] COMPOUND SEMICONDUCTOR FIELD EFFECT TRANSISTOR HAVING A GATE INSULATOR FORMED OF INSULATIVE SUPERLATTICE LAYER

[75] Inventor: Yasunobu Nashimoto, Tokyo, Japan
[73] Assignee: NEC Corporation, Tokyo, Japan
[21] Appl. No.: 801,796
[22] Filed: Dec. 2, 1991
[30] Foreign Application Priority Data
   Nov. 30, 1990 [JP]   Japan ................................ 2-340918
[51] Int. Cl.$^5$ .................... H01L 29/267; H01L 29/780
[52] U.S. Cl. ..................................... 257/192; 257/411
[58] Field of Search ................. 357/4, 16, 22, 22 A, 357/22 MD, 23.2, 23.15, 15, 192, 410, 411

[56] References Cited

U.S. PATENT DOCUMENTS 5,107,314  4/1992  Kahng et al. ................. 357/23.15

FOREIGN PATENT DOCUMENTS

| | | | |
|---|---|---|---|
| 0202755 | 11/1986 | European Pat. Off. | 357/22 A |
| 0100976 | 5/1986 | Japan | 357/22 MD |
| 0210677 | 9/1986 | Japan | 357/22 A |
| 0026072 | 1/1990 | Japan | 357/23.2 |
| 0001546 | 1/1991 | Japan | 357/23.15 |

Primary Examiner—Rolf Hille
Assistant Examiner—Peter Toby Brown

[57] ABSTRACT

A field effect transistor comprises a current channel layer formed on an InP substrate through a buffer layer and formed of InGaAs having a lattice constant in match with that of InP, and a source electrode and a drain electrode formed on the current channel layer separately from each other and in ohmic contact with the current channel layer. An insulator layer is formed on the current channel layer between the source electrode and the drain electrode, and a gate electrode is formed on the insulator layer. The insulator layer being composed of a superlattice layer formed of alternately stacked undoped InAs thin films and undoped AlAs thin films. A ratio $t_1/t_2$ of the thickness $t_1$ of each one InAs thin film and the thickness $t_2$ of one AlAs thin film adjacent to the each one InAs thin film is gradually reduced toward to an upper surface of the superlattice layer.

15 Claims, 2 Drawing Sheets

COMPOUND SEMICONDUCTOR FIELD EFFECT TRANSISTOR HAVING A GATE INSULATOR FORMED OF INSULATIVE SUPERLATTICE LAYER

BACKGROUND OF THE INVENTION

1. Field of the invention

The present invention relates to a compound semiconductor field effect transistor, and more specifically to such a field effect transistor utilizing a semiconductor heterojunction.

2. Description of related art $In_xGa_{1-x}As$ (x=0.530 which is a compound semiconductor having a lattice constant in match with that of an InP substrate, has an electron mobility and a saturation speed which are higher than those of GaAs, and therefore, can be said to be a semiconductor material more suitable to a field effect transistor (called "FET") operating at a super high frequency band of not less than 1 GHz. Therefore, various FET structures using this $In_xGa_{1-x}As$ (x=0.53) have been proposed.

However, since a barrier height in a Schottky junction between a metal and $In_xGa_{1-x}As$ (x=0.53) is as very small as 0.2 eV, when a metal Schottky junction gate FET (called "MESFET"), which has already reduced to practice in the case of GaAs, is constituted of $In_xGa_{1-x}As$ (x=0.53), a gate leakage current is too large. Because of this, the MESFET constituted of $In_xGa_{1-x}As$ (x=0.53) has not yet been reduced to practice. On the other hand, if a metal/oxide/semiconductor FET (called "MOSFET"), which is widely used in the field of silicon, is consitituted of $In_xGa_{1-x}As$ (x=0.53), there exists no suitable oxide insulator material which can form a good junction between $In_xGa_{1-x}As$ (x=0.53) and the oxide insulator material. Because of this, the MOSFET constituted of $In_xGa_{1-x}As$ (x=0.53) has not yet been reduced into practice.

On the other hand, $In_yAl_{1-y}As$ (y=0.52) which is also one of compound semiconductors, has the lattice constant in match with that of $In_xGa_{1-x}As$ (x=0.53), and can be epitaxially grown on InP or $In_xGa_{1-x}As$ (x=0.53). For this feature, $In_yAl_{1-y}As$ (y=0.52) including no impurity has possibility of being used as a gate insulator layer in a metal/insulator/semiconductor FET (called "MISFET") using InGaAs. For example, this type of MISFET has been proposed in IEEE Electron Device Letter, EDL-1,154(1980) and IEEE Electron Device Letter, EDL-1,174(1980). The proposed MISFET has a transconductance of 135 mS/mm in the case having a gate length of 0.6 μm. This is superior to a GaAs MESFET having a similar device structure.

However, in the case of the mixture ratio y=0.52 of $In_yAl_{1-y}As$, the Schottky barrier height of the Schottky junction between the gate electrode and $In_yAl_{1-y}As$ is only about 0.8 eV. In particular, when this MISFET is operated in an enhancement mode, since a positive gate bias voltage is applied, a gate leakage current reaches to about 10 $A/cm^{-2}$ or more.

In order to overcome this problem, it may be considered to use, in place of InGaAs, $Al_zGa_{1-z}As$ ($0<z\leq 1$) which has the Schottky barrier height of greater than 0.8 eV. In this case, since AlGaAs and InGaAs are different in lattice constant, a lattice match cannot be realized, and therefore, dislocation defects of crystal occur at a heterojunction boundary between AlGaAs and InGaAs because of difference in lattice constant. As a result, a new problem such as unstable characteristics of FET occurs.

SUMMARY OF THE INVENTION

Accordingly, it is an object of the present invention to provide a compound semiconductor field effect transistor which has overcome the above mentioned defect of the conventional ones.

Another object of the present invention is to provide a compound semiconductor field effect transistor including a current channel formed of InGaAs without dislocation defect of crystal at a heterojunction boundary between a gate insulator layer and the InGaAs current channel layer, and which has a high Schottky barrier height capable of sufficiently suppressing a gate leakage current even if the FET is used in an enhancement mode.

The above and other objects of the present invention are achieved in accordance with the present invention by a field effect transistor comprising an InGaAs current channel layer, a source electrode and a drain electrode formed on the current channel layer separately from each other and in ohmic contact with the current channel layer, an insulator layer formed on the current channel layer between the source electrode and the drain electrode, and a gate electrode formed on the insulator layer, the insulator layer being composed of a superlattice layer formed of alternately stacked updoped InAs thin films and undoped AlAs thin films, a ratio $t_1/t_2$ of the thickness $t_1$ of each one InAs thin film and the thickness $t_2$ of one AlAs thin film adjacent to each InAs thin film being gradually reduced toward to an upper surface of the superlattice layer.

Recently, it has become possible to epitixially grow compound semiconductor thin layers of different lattice constants without dislocation defect, by alternately stacking or laminating the compound semiconductor thin layers of different lattice constants by a molecular beam epitaxy (called "MBE"), while ensuring that a thickness of each thin layer does not exceed a critical film thickness. This critical film thickness can be defined that if the thickness of each thin layer exceeds the critical film thickness, a dislocation defect begins to occur in crystal.

If this technique is used, thin layers of InAs and AlAs, the lattice constants of which differ from each other by about seven percent, can be alternately stacked to have a total thickness of about several hundred angstroms to about one thousand angstroms, by limiting each thin layer to a thickness of about 50 Å or less or by limiting at least one of a pair of adjacent InAs and AlAs thin layers to a thickness of about 50 Å or less. On the other hand, when y=0.52, $In_yAl_{1-y}As$ can have the lattice constant in match with that of $In_{0.53}Ga_{0.47}As$. A compound semiconductor having the same property as that of this $In_{0.52}Al_{0.48}As$ can be formed of a superlattice layer which is formed by alternately stacking InAs thin layers and AlAs thin layers. Namely, assuming that the InAs thin layer has a thickness $t_1$ and the AlAs thin layer has a thickness $t_2$, if the ratio $t_1/t_2$ is 0.52/0.48 ($\approx 1.08$), the superlattice layer formed of the alternately stacked InAs thin layers and AlAs thin layers becomes equivalent to $In_{0.52}Al_{0.48}As$. Therefore, it can be deemed that an averaged lattice constant is consistent with that of InP. Therefore, if this superlattice layer is grown on the $In_{0.53}Ga_{0.47}As$ layer forming the current channel layer of the FET, it is possible to prevent generation of dislocation defect which would have occurred at a semiconductor heterojunction boundary due to mismatching of the lattice constant.

On the other hand, if the ratio $t_1/t_2$ is reduced in the superlattice layer towards the gate electrode, namely, if the proportion of the InAs thin layer to the AlAs thin layer is reduced towards to the gate electrode, an averaged energy band gap in the superlattice layer can be increased toward the gate electrode. In other words, this makes it possible to easily elevate the Schottky junction barrier between a metal gate electrode and the superlattice layer to a value which is near about 1.2 eV obtained in the case of AlAs. Because of this reason, the ratio $t_1/t_2$ is reduced toward to the upper surface of the superlattice layer in the present invention.

The above and other objects, features and advantages of the present invention will be apparent from the following description of preferred embodiments of the invention with reference to the accompanying drawings.

DESCRIPTION OF THE PREFERRED EMBODIMENTS

Figure 1:
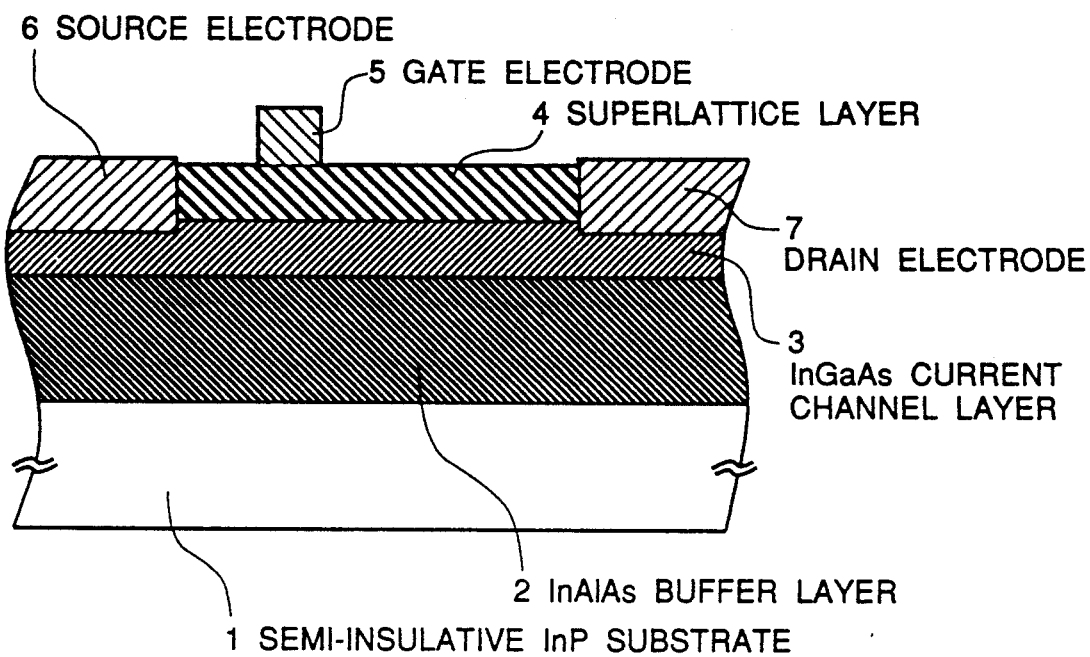
FIG. 1 is a diagrammatic sectional view of a first embodiment of the MISFET in accordance with the present invention.

Referring to FIG. 1, there is shown a diagrammatic sectional view of a first embodiment of the MISFET in accordance with the present invention.

The shown MISFET includes a semi-insulative InP substrate 1 which is doped with Fe (iron) and which has a surface orientation (100). An InAlAs buffer layer 2 having no impurity and a thickness of 3000 Å, and an InGaAs current channel layer 3 doped with Si (silicon) at a concentration of $1 \times 10^{18}$ cm$^{-3}$ and having a thickness of 200 Å are epitixially grown on the InP substrate 1 in the names order by a known MBE process. The composition ratio of In in the InAlAs buffer layer 2 and the InGaAs current channel layer 3 is 0.52 and 0.53, respectively, (namely, $In_{0.52}Al_{0.48}As$ and $In_{0.53}Ga_{0.47}As$) so that each of the InAlAs buffer layer 2 and the InGaAs current channel layer 3 has the lattice constant in match with that of the semi-insulative InP substrate 1, and therefore, the InAlAs buffer layer 2 and the InGaAs current channel layer 3 are in lattice match with the semi-insulative InP substrate 1.

A source electrode 6 and a drain electrode 7, which are formed of AuGe.Ni alloy, are located on the InGaAs current channel layer 3 in ohmic contact with the InGaAs current channel layer 3 at a low resistance. The source electrode 6 and a drain electrode 7 are separated from each other by a superlattice layer 4, which is also formed on the InGaAs current channel layer 3. The superlattice layer 4 is formed of alternately stacked InAs thin films and AlAs thin films. An aluminum gate electrode 5 is formed on the superlattice layer 4 for the purpose of controlling through the superlattice layer 4 an electron concentration in the InGaAs current channel layer 3 so that an electric current flowing between the source electrode 6 and the drain electrode 7 is controlled.

Figure 2:
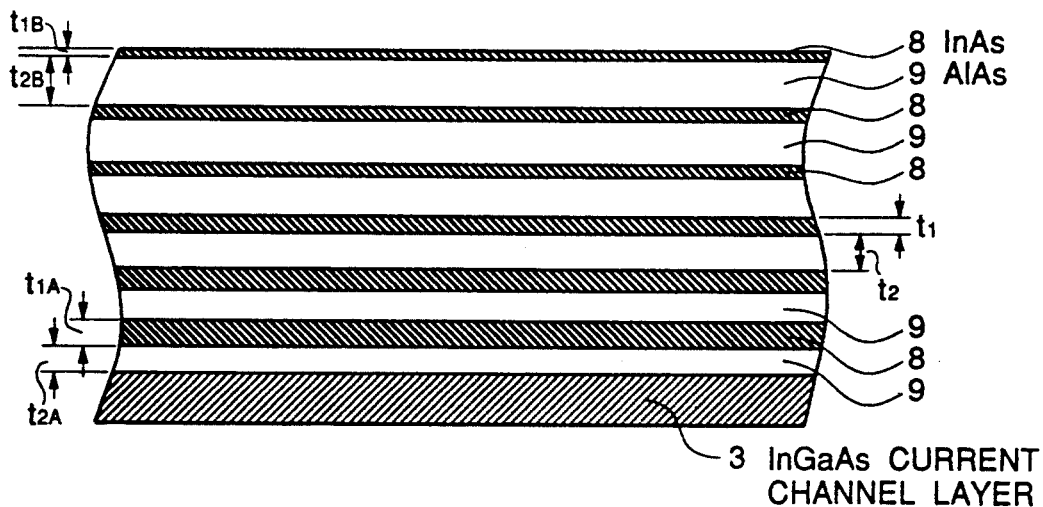
FIG. 2 is a partial enlarged diagrammatic sectional view of the superlattice layer of the MISFET shown in FIG. 1.

Referring to FIG. 2, there is shown a partial enlarged diagrammatic sectional view for illustrating a detailed structure of the superlattice layer 4. The superlattice layer 4 is formed by alternately epitaxially growing InAs thin films 8 and AlAs thin films 9 on the InGaAs current channel layer 3, by means of the MBE process.

The thickness $t_{2A}$ of a first AlAs thin film 9 in contact with the InGaAs current channel layer 3 and the thickness $t_{1A}$ of a first InAs thin film 8 in contact with the first AlAs thin film 9 are determined in such a manner that a ratio of $t_{1A}/t_{2A}$ is as near as possible to 0.52/0.48 ($\approx 1.08$), so that an averaged lattice constant of the first AlAs thin film 9 and the first InAs thin film 8 is consistent with the lattice constant of the $In_{0.53}Ga_{0.47}As$ current channel layer 3. In addition, in order to prevent generation of dislocation defect at the semiconductor heterojunction boundary, growth of the first AlAs thin film 9 and the first InAs thin film 8 is controlled so that the first AlAs thin film 9 and the first InAs thin film 8 have a thickness of about 52 Å and a thickness of about 48 Å respectively, which are not greater than the critical film thickness.

The AlAs thin films 9 and the InAs thin films 8 sequentially and alternately stacked on the first InAs thin film 8 are controlled to the effect that each pair of adjacent thin films consisting of one AlAs thin film and one InAs thin film formed on the one AlAs thin film have a total thickness of about 100 Å, but the ratio $t_1/t_2$ of the thickness $t_1$ of the InAs thin film to the thickness $t_2$ of the AlAs thin film included in each pair of adjacent thin films gradually becomes small towards an upper surface of the superlattice layer 4. In an uppermost pair of AlAs thin film and InAs thin film adjacent to the gate electrode 5, the ratio $t_{1B}/t_{2B}$ becomes about 0.064. For example, ten AlAs thin films 9 and ten InAs thin films 8 are alternately stacked.

In the InGaAs MISFET shown in FIG. 1, the barrier height of the Schotty junction between the aluminum gate electrode 5 and the superlattice layer 4 is about 1 eV. As a result, the gate electrode leakage current when a positive biasing voltage is applied to the gate electrode is remarkably decreased in comparison with the case in which a $In_{0.52}Al_{0.48}As$ layer is used in place of the superlattice layer 4. For example, when a gate bias voltage is +0.5 V, the gate leakage current is on the order of $10^{-1}$ to $10^{-2}$ A/cm$^{-2}$. This value is less than one hundredth of the gate leakage current when the $In_{0.52}Al_{0.48}As$ layer is used. With this feature, a noise performance in a super high frequency band of an enhancement mode InGaAs current channel MISFET is greatly improved. In addition, since the barrier height of the Schottky junction becomes high, a reverse direction breakdown voltage of the gate electrode is elevated, and therefore, the shown MISFET can be used as a large power device in a super high frequency.

Figure 3:
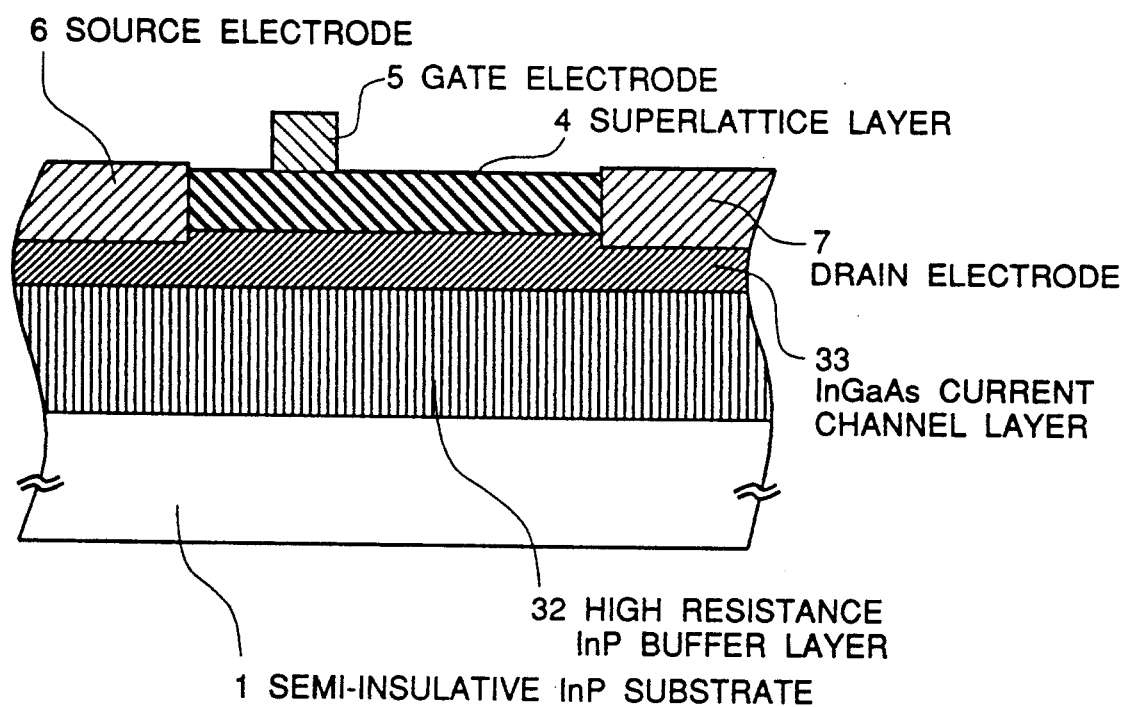
FIG. 3 is a diagrammatic sectional view of a second embodiment of the MISFET in accordance with the present invention.

Referring to FIG. 3, there is shown a diagrammatic sectional view of a second embodiment of the MISFET in accordance with the present invention. In FIG. 3, elements similar to those shown in FIG. 1 are given the same Reference Numerals.

The second embodiment shown in FIG. 3 is different from the first embodiment shown in FIG. 1, in which a high resistance InP buffer layer 32 is used in place of the InAlAs buffer layer 2 of the first embodiment.

The second embodiment of the MISFET includes a semi-insulative InP substrate 1 which is doped with Fe (iron) and which has a surface orientation (100). A high resistance InP buffer layer 32 doped with Fe and having a thickness of about 1 μm, and an $In_{0.53}Ga_{0.47}As$ current channel layer 33 doped with S (sulfur) at a concentration of $1 \times 10^{18}$ cm$^{-3}$ and having a thickness of 200 Å are epitixially grown on the InP substrate 1 in the named order by a known MBE process. A superlattice layer 4, a gate electrode 5, a source electrode 6 and a drain electrode 7 are formed similarly to the first embodiment of the MISFET In the second embodiment of the InGaAs MISFET, when a positive bias voltage is applied to the gate electrode, the gate electrode leakage current is greatly decreased, similarly to the first embodiment. In addition, a reverse direction breakdown voltage of the gate electrode is elevated, and performance in a super high frequency band is improved.

As seen from the above description of the embodiments with reference to the drawings, the MISFET in accordance with the present invention is characterized in that the gate insulator layer is formed of the superlattice layer composed by alternately stacking or laminating undoped InAs thin films and undoped AlAs thin films in such a manner that a surface in contact with the $In_{0.53}Ga_{0.47}As$ current channel layer equivalently has the same lattice constant as that of $In_{0.53}Ga_{0.47}As$, and a surface in contact with the gate electrode produces a sufficient high Schottky junction barrier between the gate electrode and the gate insulator layer.

With this feature, no dislocation defect of crystal occurs at a heterojunction boundary between the $In_{0.53}Ga_{0.47}As$ current channel layer and the superlattice layer. In addition, the gate electrode leakage current can be remarkably reduced, and a reverse direction breakdown voltage of the gate electrode can be elevated. Accordingly, inherent excellent electric characteristics of InGaAs can be sufficiently exerted. Therefore, the present invention is very effective in designing and manufacturing the field effect transistor operating in super high frequency band.

The invention has thus been shown and described with reference to the specific embodiments. However, it should be noted that the present invention is in no way limited to the details of the illustrated structures but changes and modifications may be made within the scope of the appended claims.

I claim:

1. A field effect transistor comprising an InGaAs current channel layer, a source electrode and a drain electrode formed on said current channel layer separately from each other and in ohmic contact with said current channel layer, an insulator layer formed above and in contact with said current channel layer between said source electrode and said drain electrode, and a gate electrode formed above and in contact with said insulator layer, said insulator layer being composed of a superlattice layer formed of alternately stacked undoped InAs thin films and undoped AlAs thin films, a ratio $t_1/t_2$ of the thickness $t_1$ of each one InAs thin film and the thickness $t_2$ of one AlAs thin film adjacent to said each one InAs thin film being gradually reduced toward an upper surface of said superlattice layer.

2. A field effect transistor claimed in claim 1 wherein said InGaAs current channel layer is formed of $In_{0.53}Ga_{0.47}As$ and wherein a pair of adjacent thin films which consists of one InAs thin film and one AlAs thin film and is adjacent to said current channel layer has said ratio $t_1/t_2$ of thickness equal to about 1.08.

3. A field effect transistor claimed in claim 2 wherein a lowermost InAs thin film included in said superlattice layer has a thickness of about 52 Å and a lowermost AlAs thin film included in said superlattice layer has a thickness of about 48 Å.

4. A field effect transistor claimed in claim 3 wherein a pair of adjacent thin films which consists of one InAs thin film and one AlAs thin film and is adjacent to said gate electrode has said ratio $t_1/t_2$ of thickness substantially equal to 0.0064.

5. A field effect transistor claimed in claim 4 wherein said gate electrode is formed of a metal which forms a Schottky barrier between said gate electrode and said superlattice layer.

6. A field effect transistor claimed in claim 5 wherein each pair consisting of an upper InAs thin film and an adjacent lower AlAs thin film included in said superlattice layer has a total thickness of about 100 Å.

7. A field effect transistor claimed in claim 6 wherein said superlattice layer includes at least ten layers of said InAs thin films and at least ten layers of said AlAs thin films.

8. A field effect transistor claimed in claim 4 wherein said current channel layer is formed on a buffer layer formed on a semi-insulative InP substrate.

9. A field effect transistor claimed in claim 8 wherein said buffer layer is formed of InAlAs.

10. A field effect transistor claimed in claim 8 wherein said buffer layer is formed of a high resistance InP.

11. A field effect transistor comprising an $In_{0.53}Ga_{0.47}As$ current channel layer, a source electrode and a drain electrode formed on said current channel layer separately from each other and in ohmic contact with said current channel layer, an insulator layer formed above and in contact with said current channel layer between said source electrode and said drain electrode, and a gate electrode formed above and in contact with said insulator layer, said insulator layer being composed of a superlattice layer formed of alternately stacked undoped InAs thin films and undoped AlAs thin films, a ratio $t_1/t_2$ of the thickness $t_1$ of each one InAs thin film and the thickness $t_2$ of one AlAs thin film adjacent to said each one InAs thin film being gradually reduced toward an upper surface of said superlattice layer in such a manner that a pair of adjacent thin films which consists of one InAs thin film and one AlAs thin film and is adjacent to said current channel layer has said ratio $t_1/t_2$ of thickness equal to about 1.08, and a pair of adjacent thin films which consists of one InAs thin film and one AlAs thin film and is adjacent to said gate electrode has said ratio $t_1/t_2$ of thickness substantially equal to 0.0064.

12. A field effect transistor claimed in claim 11 wherein a lowermost InAs thin film included in said superlattice layer has a thickness of about 52 Å and a lowermost AlAs thin film included in said superlattice layer has a thickness of about 48 Å.

13. A field effect transistor claimed in claim 11 wherein said current channel layer is formed on a buffer layer formed on a semi-insulative InP substrate.

14. A field effect transistor claimed in claim 13 wherein said buffer layer is formed of $In_{0.52}Al_{0.48}As$.

15. A field effect transistor claimed in claim 13 wherein said buffer layer is formed of a high resistance InP.

* * * * *